United States Patent [19]

Takano et al.

[11] Patent Number: 4,866,134
[45] Date of Patent: Sep. 12, 1989

[54] LAMINATE WITH LAYER OF RUBBER-MODIFIED VINYL ESTER AND UNSATURATED POLYESTER

[75] Inventors: Hidekazu Takano, Kohriyama; Tetsuo Kunitomi, Shijonawate; Shigehiro Okada; Toshio Awaji, both of Toyonaka; Katsuaki Shindo, Osaka; Daisuke Atobe, Suita, all of Japan

[73] Assignees: Matsushita Electric Works, Ltd.; Nippon Shokubai Kagaku Kogyo Co., Ltd., both of Osaka, Japan

[21] Appl. No.: 184,373

[22] Filed: Apr. 21, 1988

Related U.S. Application Data

[63] Continuation-in-part of Ser. No. 882,495, Jul. 7, 1986, abandoned, which is a continuation-in-part of Ser. No. 721,327, Apr. 9, 1985, abandoned.

[30] Foreign Application Priority Data

Apr. 11, 1984 [JP] Japan ................................. 59-70912

[51] Int. Cl.⁴ ............................................. C08L 63/10
[52] U.S. Cl. .................................... 525/109; 525/112; 428/349; 428/416; 428/462
[58] Field of Search ................ 525/122, 109; 428/349, 428/416, 462

[56] References Cited

U.S. PATENT DOCUMENTS 3,892,819  7/1975  Najvar .................................. 525/531

Primary Examiner—Lewis T. Jacobs
Assistant Examiner—Robert E. L. Sellers, II
Attorney, Agent, or Firm—Omri M. Behr

[57] ABSTRACT

An electric metal foil-plated laminate sheet which is obtained by laminating a cured layer of a thermosetting resin composition with electroconductive foils, said thermosetting resin composition comprising 30–85% by weight of (A) a rubber-modified vinyl ester obtained by reacting, (a) an epoxy resin,
(b) a carboxyl group containing rubbery polymer derived from a conjugated diene, and
(c) at least one unsaturated monocarboxylic acid selected from the group consisting of acrylic acid and methacrylic acid to react one another in amounts such that, based on 100 parts by weight of (a) the epoxy resin, (b) the carboxyl group containing rubbery polymer accounts for a proportion in the range of 5 to 80 parts by weight and that the total number of carboxylic group contained in (b) the rubbery polymer and (c) the unsaturated monocarboxylic acid falls in the range of 1.3 to 1.5 per each of the epoxy groups contained in (a) the epoxy resin at a temperature of 90° to 120° C., 5–30% weight of (B) a specific unsaturated polyester, and 10–60% by weight of (C) a radically polymerizable unsaturated monomer, wherein (A)+(B)+(C) equals 100% by weight.

12 Claims, No Drawings

LAMINATE WITH LAYER OF RUBBER-MODIFIED VINYL ESTER AND UNSATURATED POLYESTER

RELATED APPLICATION

This application is a continuation-in-part of application, Ser. No. 882,495, filed July 7, 1986, now abandoned, which in turn is a continuation-in-part Ser. No. 721,327, filed Apr. 9, 1985, now abandoned.

BACKGROUND OF THE INVENTION

1. Field of the Invention

This invention relates to an electric metal foil-plated laminate sheet excelling in workability, heat resistance, water resistance, electrical properties and adhesion to metal foil.

2. Description of the Prior Art

It is widely known that thermosetting resins, particularly radical polymerization type thermosetting resins represented by unsaturated polyester resins are finding extensive utility in numerous applications because they exhibit high workability and curability during the course of molding and further because their cured products possess well balanced properties. Especially, fiber-reinforced resin composites (hereinafter referred to briefly as "FRP") obtained by combining such thermosetting resins with reinforcing materials represented by glass fibers are used in radar domes, tanks, ducts, dam, ships and bodies of vehicles, for example. They manifest outstanding properties in the various applications because the thermosetting resins and the reinforcing materials composite their respective properties.

Despite the outstanding properties owned by the FRP as described above, the properties of some if not all of FRP, depending on the field of the electric metal foil-plated laminate sheet, do not prove to be completely satisfactory.

To be more specific, an attempt at effectively deriving the outstanding properties of the resin such as heat resistance, water resistance and electrical properties tends to entail the disadvantage that said laminate sheet are liable to gain in rigidity and lost impact resistance and, while being processed by punching, suffer cracks and induce separation of layers of laminates. Conversely, an attempt at improving impact resistance and stability to endure the impact of punching results in the disadvantage that the aforementioned boards suffer from impaired resistance to heat and water and, on exposure to a highly humid atmosphere, absorbs water with an appreciable sacrifice of electrical properties, and tends to suffer blisters and cracks under the thermal impact from the soldering treatment.

Further, in the case of using copper foil or aluminum foil there is the disadvantage that an additional adhesive is specially added because of their poor adhesion to them.

An object of this invention, therefore, is to provide a novel electric metal foil-plated laminate sheet excelling in workability, heat resistance, water resistance, electrical properties and adhesion to metal foil.

SUMMARY OF THE INVENTION

The object described above is attained by an electric metal foil-plated laminate sheet which is obtained by laminating a cured layer of a thermosetting resin composition with electroconductive foil, said thermosetting resin composition (hereinafter referred to as thermosetting resin composition (I)) comprising (A) 30–85% by weight of a rubber-modified vinyl ester obtained by reacting (a) an epoxy resin, (b) a carboxyl group containing rubbery polymer derived from a conjugated diene, and (c) at least one unsaturated monocarboxylic acid selected from the group consisting of acrylic acid and methacrylic acid to react with one another in amounts such that, based on 100 parts by weight of (a) the epoxy resin, (b) the carboxyl group containing rubbery polymer accounts for a proportion in the range of 5 to 80 parts by weight and that the total number of carboxyl group contained in (b) the rubbery polymer and (c) the unsaturated monocarboxylic acid falls in the range of 1.3 to 1.5 per each of the epoxy groups contained in (a) the epoxy resin at a temperature of 90° to 120° C., (B) 5–30% by weight of an unsaturated polyester derived from a dihydric alcohol represented by the formula I in an amount accounting for at least 50% by equivalent weight based on the total alcohol component:

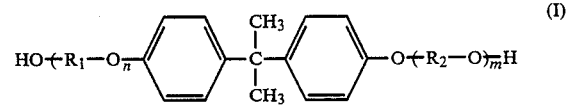

wherein m and n independently denote an integer of the value of 1 to 4 and collectively satisfy the expression, $2 \leq m+n \leq 5$, $R_1$ and $R_2$ independently denote an alkylene group having 2 or 3 carbon atoms, and the part $(R_1-O)_n$ and the part $(R_2-O)_m$ each may denote a random bond of mutually different repeating units, and (C) 10 to 60% by weight of a radically polymerizable unsaturated monomer, based on total amounts of said composition, wherein total of (A), (B) and (C) equals 100% by weight.

DESCRIPTION OF THE PREFERRED EMBODIMENTS

First, the rubber-modified vinyl ester aimed at by this invention is obtained by reacting (a) an epoxy resin, (b) a carboxyl group containing rubbery polymer derived from a conjugated diene, and (c) at least one unsaturated monocarboxylic acid to react with one another in amounts such that, based on 100 parts by weight of (a) the epoxy resin, (b) the carboxyl group containing rubbery polymer accounts for a proportion in the range of 5 to 80 parts by weight and that the total number of the carboxyl group contained in (b) the rubbery polymer and (c) the unsaturated monocarboxylic acid falls in the range of 1.3 to 1.5 per each of the epoxy groups contained in (a) the epoxy resin at a temperature of 90° to 120° C.

The term (a) "epoxy resin" as used in the present invention designates a compound possessing at least two epoxy groups in the molecular unit thereof. Any compound called by the name "epoxy resin" can be effectively utilized in the present invention. As (a) the epoxy resin, any of the epoxy resins described as in the Lecture on Plastic Materials, Part 1 "Epoxy Resins" (compiled by Kuniyuki Hashimoto and published by Nikkan Kogyo Shinbunsha on May 30, 1969), pp 19–48, and Report 38, "EPOXY RESINS," (published by Stanford Research Institute in June, 1968), pages 25–39, can be utilized. Among other epoxy resins answering the foregoing description, the epoxy resins derived from bisphenol A, bisphenol F, brominated bisphenol A, phenol novolak, brominated phenol novolak, cresol novolak, etc. with epichlorohydrin and/or 2-methyl epichlorohydrin prove particularly advantageous from the standpoint of properties. Especially the epoxy resins which are derived from brominated bisphenol A, brominated phenol novolak, phenol novolak and cresol novolak are desirable in the sense that they manifest effectively the effects for, which the present invention is intended.

(a) The epoxy resin, prior to use, can have part thereof substituted with a monovalent epoxy compound such as phenyl glycidyl ether, epichlorohydrin, glycidyl (meth)acrylate, styrene oxide or allyl glycidyl ether. The largest amount in which the monovalent epoxy compound can be used for the substitution is 15% by equivalent weight based on the total amount of all the epoxy compounds. If the amount exceeds 15% by equivalent weight, the effect aimed at by this invention cannot be effectively manifested because the properties to be acquired by the produced electric metal foil-plated laminate sheet fall short of the desired levels.

(b) The carboxyl group containing rubbery polymer derived from a conjugated diene (hereinafter referred to as "rubbery polymer (b)") can be obtained either by copolymerizing a monomer containing a carboxyl group and a monomeric conjugate diene, optionally in conjunction with other suitable monomers, or by copolymerizing a monomeric conjugate diene with another monomer and introducing into the resultant copolymer carboxyl group. The carboxyl group may be positioned at the terminal or in the side chain of the molecule. The number of carboxyl group in the molecular unit is desired to fall in the range of 1 to 5, preferably 1.5 to 3. If the number of carboxyl groups is too large, the effect in the improvement of toughness is less than is expected. If it is too small, the produced (A) rubber-modified vinyl ester exhibits poor affinity for (C) a polymerizable unsaturated monomer or (B) an unsaturated polyester with which it is to be used.

Examples of the monomeric conjugate diene include butadiene, isoprene and chloroprene. Examples of the other monomer which is optionally used include acrylonitrile, styrene, methyl styrene, halogenated styrenes, esters of unsaturated monobasic acids and dibasic acids, allyl alcohol, allyl ethers and allyl esters. From the standpoint of the affinity which the produced (A) rubber-modified vinyl ester exhibits to (C) the polymerizable unsaturated monomer or (B) unsaturated polyester, it is desirable to have acrylonitrile copolymerized into (b) the rubbery polymer in an amount in the range of 5 to 50% by weight, preferably 8 to 40% by weight. If the amount of acrylonitrile is less than 5% by weight, the electric metal foil-plated laminate sheet tends to show lower resistance to heat than is desired. If it exceeds 50% by weight, the produced rubber-modified vinyl ester is liable to acquire insufficient toughness.

(b) The rubbery polymer suitable for use in this invention can have its number-average molecular weight falling in a wide range. From the standpoint of the affinity, the produced (A) rubber-modified vinyl ester exhibits for (C) the polymerizable unsaturated monomer or (B) unsaturated polyester and the toughness of the electric metal foil-plated laminate sheet, the rubbery polymer (b) is desired to have a number-average molecular weight in the range of about 1,000 to about 20,000.

In the preparation of (A) the rubber-modified vinyl ester of this invention by the reaction of (a) an epoxy resin, (b) a rubbery polymer, and (c) an unsaturated monocarboxylic acid selected from the group consisting of acrylic acid and methacrylic acid, these three components are used, as described above, in amounts such that based on 100 parts by weight of (a) the epoxy resin, (b) the rubbery polymer accounts for a proportion in the range of 5 to 80 parts by weight, preferably 10 to 60 parts by weight and that the total number of carboxyl groups contained in the components (b) the rubbery polymer and (c) the unsaturated monocarboxylic acid is in the range of 1.3 to 1.5, per each of the epoxy groups contained in the component (a).

If the amount of (b) the rubbery polymer falls short of the lower limit of the range mentioned above, the effect in the improvement of toughness of the electric metal foil-plated laminate sheet is not sufficient. If it exceeds the upper limit of the range, they acquires insufficient resistance to heat.

If the total number of carboxyl groups contained in (b) the rubbery polymer and (c) acrylic acid and/or methacrylic acid per each of the epoxy groups contained in (a) the epoxy resin is larger than the upper limit of the range mentioned above, the water absorption of the electronic metal foil-plated laminate sheet increases because of remaining a large amount of (c) acrylic acid and/or methacrylic acid unreacted. Adversely, if it is under the lower limit of the range, in manufacturing (A) the rubber-modified vinyl ester the reaction time grows longer and it is liable to color, furthermore the adhesion of said laminate sheet decreases outstandingly.

In the present invention, the produced (A) rubber-modified vinyl ester can be suitably adjusted in terms of viscosity, acid number, reactivity, etc. by substituting part of (c) acrylic acid and/or methacrylic acid with other proper carboxylic acid (examples of the other carboxylic acid usable for this purpose include monocarboxylic acids such as acetic acid, valeric acid, stearic acid, benzoic acid and cinnamic acid, and anhydrides thereof; and polycarboxylic acids such as phthalic acid, fumaric acid, maleic acid, succinic acid, adipic acid, sebacic acid, tetrahydrophthalic acid, halogenated phthalic acids, 3,6-endomethylene tetrahydrophthalic acid, pyromellitic acid, trimellitic acid and butane tetracarboxylic acid, and anhydrides thereof) used as a modifying agent. Generally, the amount of this modifying agent to be used is not more than 10% by equivalent weight based on the total amount of (c) acrylic acid and/or methacrylic acid.

The aforementioned reaction of (a) the epoxy resin, (b) the rubbery polymer, and (c) the acrylic acid and/or methacrylic acid can be carried out at a temperature of 80° to 120° C. For example, (a) the epoxy resin, (b) the rubbery polymer, and (c) the acrylic acid and/or methacrylic acid are allowed to react with one another at a temperature in the range of 80° to 120° C. in the presence of a reaction catalyst such as lithium chloride, triethylamine or dimethylbenzyl amine-hydrogen chloride salt and a polymerization inhibitor such as hydroquinone, tertiary butyl catechol, methoquinone or molecular oxygen. If the reaction temperature is lower than 80° C., reaction rate is too slow, so it is not practical, while if the temperature is higher than 120° C., reaction rate is too high, so it is undesirable because not only control of the temperature is difficult, but also by-product reaction such as thermal polymerization of acrylic group and coloration. In the method described above, the reaction system tolerates a solvent. Examples of the solvent so used include inactive solvents such as toluene, xylene, methyl isobutyl ketone and ethyl acetate and more desirably polymerizable unsaturated monomers (indicated as (C) afterward) such as styrene, methyl styrene, diallyl phthalate, alkyl acrylates and alkyl methacrylates.

The reaction of (a) the epoxy resin, (b) the rubbery polymer, and (c) the acrylic acid and/or methacrylic acid can be carried out in one step or in more than two separate steps. The more than two-step reaction can be carried out by a procedure of causing (a) the epoxy resin to react with either (b) the rubbery polymer or (c) the acrylic acid and/or methacrylic acid and allowing the remaining component to react upon the first reaction mixture, a procedure similar to the procedure just described, except that (b) the rubbery polymer and/or (c) the unsaturated monocarboxylic acid is added to the reaction system in not less than two separate portions, or a procedure of causing part of (a) the epoxy resin (desirably in an amount of at least twice the equivalent weight of the rubbery polymer) to react with (b) the rubbery polymer and part of the (c) acrylic acid and/or methacrylic acid (desirably the sum of the (b) rubbery polymer and (c) acrylic acid and/or methacrylic acid is in an amount of 1.3 to 1.5 by equivalent weight of (a) the epoxy resin), separately causing the remaining part of the component (a) to react with the remaining part of the component (c), and mixing the two reaction products. Among other methods enumerated above, the method which comprises allowing a part of (a) and (b), or a part of (a), (b) and (c) to react in advance (preferably the acid number of the resulting reaction system proceeds not more than the two thirds of the initial value thereof, and most preferably until not more than one half of the initial value thereof) and then allowing the remaining component to react upon the above reaction mixture proves particularly desirable.

The unsaturated polyester (B) is indispensable specific unsaturated polyester in order to increase moisture resistance (especially PCT property) and resistance to solvent (especially resistance to methylene chloride) of the electric metal foil-plated laminate sheet. The electric metal foil-plated laminate sheet without using the unsaturated polyester (B) or with using an unsaturated polyester other than the polyester (B) is inferior in moisture resistance and resistance to solvent, so the use thereof is considerably limited and it is not desirable. That is to say, the laminate sheet having inferior moisture resistance (generally represented by hygroscopic property in PCT and heat resistance of soldering at 260° C. after treatment) cannot be used because troubles about snapping of a wire of through hole plating happen many times when it is at soldering step when it is used, so it cannot no longer be used. Further, the laminate sheet having low resistance to methylene chloride cannot be adapted a step for removing a resist ink by methylene chloride after etching of a metal foil, so use thereof is remarkably limited.

(B) The unsaturated polyester can easily be prepared by reacting an unsaturated polycarboxylic acid or anhydride and, if necessary, a saturated polycarboxylic acid or anhydride with a polyhydric alcohol containing at least a dihydric alcohol represented by the formula I based on a conventional method. For example, it is prepared by the following method:

(1) Polycarboxylic acids or anhydrides and polyhydric alcohols are successively charged, an inert gas is introduced by bubbling from the bottom and an inhibitor in solution is added. With mild heating, the acids rapidly melt in the alcohols, some initial foaming occurs.

(2) A slow, stepwise heating cycle is followed over a 3- to 4-hour period, gradually raising the mix to the final reacting temperature. Acid number and viscosity control measurements are made during this period. Water is liberated and removed by the condenser.

(3) The mix is kept at 410° F. (210° C.) until the acid number is less than 50, or reaches the desired value (which may be lower), and also until the viscosity is within predetermined limiting values.

Typical examples of the polycarboxylic acids or anhydrides include maleic anhydride, maleic acid, fumaric acid, citraconic acid, itaconic acid, tetrachlorophthalic acid, chlorendic acid (HET), endomethylenetetrahydrophthalic anhydride, phthalic anhydride, phthalic acid, isophthalic acid, tetrahydrophthalic anhydride, hexahydrophthalic anhydride, succinic anhydride, succinic acid, adipic acid, azelaic acid, sebacic acid, glutaric acid, and pimelic acid. Typical polyhydric alcohols include glycerol, ethylene glycol, pentaerythritol, propylene glycol, butanediol-1,4, diethylene glycol, hydrogenated bisphenol A, neopentyl glycol, butylene glycol-2,3;1,4;1,3, pentandiol-1,5, triethylene glycol, dipropylene glycol, and tripropylene glycol. As the dihydric alcohol represented by the formula I, there is isopropylidene bis (p-phenyleneoxypropanol-2), and BPX-11 (Trade name of Asahi Denka Kogyo K.K.), DB-350 (Trade name of Nippon Oil and Fats K.K.), Newpol BP-2P, BP-3P, BP-4P, BPE-20NK, and BPE-40 (Trade name of Sanyo Kasei Kogyo K.K.) are commercially available.

The term "(C) polymerizable unsaturated monomer" designates a compound which possesses at least one radically polymerizable unsaturated groups within the molecular unit thereof and has a molecular weight of not more than about 400. Typical examples of (C) the polymerizable unsaturated monomer of the foregoing description include styrene, methyl styrene, halogenated styrenes, divinyl benzene, diallyl phthalate, triallyl cyanurate and vinyl acetate, and esters of acylic acid and/or methacrylic acid such as methyl acrylate, methyl methacrylate, ethyl methacrylate, butyl acrylate, ethylene glycol diacrylate, propylene glycol dimethacrylate, dipropylene glycol methacrylate, trimethylol propane trimethacrylate, pentaerythritol tetraacrylate and trimethylol propane diacrylate. These polymerizable unsaturated monomers can be used either singly or in the form of varying combinations of two or more members.

The thermosetting resin composition (I) can be obtained by mixing 30-85% by weight of (A) the rubber-modified vinyl ester, 5-30% by weight of (B) the unsaturated polyester and 10-60% by weight of (C) the polymerizable unsaturated monomer, wherein the sum of (A), (B) and (C) equals 100% by weight. In this case, based on the total amount of the thermosetting resin composition, it is preferable that 1 to 30% by weight, preferably 3 to 20% by weight of (b) the rubbery polymer which is a structural moiety of (A) the rubber-modified vinyl ester, 7 to 20% weight of (B) unsaturated polyester and 15 to 60% by weight of (C) the polymerizable unsaturated monomer are included. If the amount of each component is beyond the limits, one or more properties of the electric metal foil-plated laminate sheet, for example such as toughness, water resistance, resistance to solvents and adhesion to metal decreases. Still more, if the amount of (B) the unsaturated polyester is under the lower limit, the stability of (I) the thermosetting resin composition is liable to become bad. The smaller the content of (C) polymerizable unsaturated monomer, the larger the above phenomenon. Therefore, when a substrate is impregnating into (II) the impregnating solution according to the following (a) molding method or (b) molding method for example, (II) the impregnating solution results in heterogeneity for the evaporation of (C) the polymerizable unsaturated monomer from the surface of (II) the said solution. As a result, the resulting electric metal foil-plated laminate sheet grows bad in its properties and acquires insufficient uniformity.

The electric metal foil-plated laminate sheet can be obtained by polymerizing (I) the above thermosetting resin composition in the presence of a radical polymerization initiator i.e., impregnating a substrate into the resulting compound, immediately or after half-curing, laminating the impregnated substrate with metal foils, and curing them. In this case, if necessary, in the (I) thermosetting resin composition a fire retardant such as organic halogenated compounds phosphates, antimony trioxide, aluminium hydroxide, etc., a interface modifier such as silane coupling agent, titanium coupling agent, etc., a filler such as calcium carboxide, a clay, etc., a colorant, an antifoamer, and other conventional known agent can be blended. As a radical polymerization initiator, an organic peroxide such as benzoil peroxide, cyclohexanone peroxide, methylethylketone peroxide and the like, and a diazo compound such as azobisisobutyronitrile are cited. In the case of using the organic peroxide or the diazo compound either singly or in the form of varying combinations of two or more members, it is usually heated to cure. On the other hand, with a promoter such as metallic soap, for example cobalt naphthenate, and amine compounds, for example dimethylaniline, it is usually at room temperature.

As a substrate to be used in the present invention, an inorganic fiber such as glass fiber, carbon fiber, etc., an organic fiber such as cellulose fiber, polyester fiber, etc., and a cloth thereof are cited now. Among other fibers enumelated above, the cloth made of glass fiber woven fabrics or glass fiber non-woven fabrics proves particularly desirable.

Examples of the electroconductive foil are copper foil and aluminum foil. Copper foil is the best choice for the purpose of this lamination.

The electric metal foil-plated laminate sheet of the present invention can be manufacutred according to various conventional known methods: for example, (a) the molding method which comprises blending the radical polymerization initiator, if necessary, above several additives with (I) the thermosetting resin composition, impregnating the substrate into the resulting compound (hereinafter referred to briefly as "impregnating solution (II)"), pre-curing the above compound impregnated in to the substrate (for example, until the hardness of a crude rubber), laminating the obtained substrate with metal foils, heating and curing them (hereinafter referred to "molding method (a)"). (b) The molding method which comprises impregnating one or more continuous substrate into (II) the impregnating solution over conveying the substrates together or independently, passing through between roll or slit the obtained substrate incorporated with metal foils, if necessary getting in between films of polyester or cellophane, laminating them, and heating with an electric oven or heating rolls substantially with under a low pressure or without pressure (hereinafter to "molding method (b)). Particularly, (b) the molding method proves desirable because of high productivity.

The electric metal foil-plated laminate sheet of the present invention excels in toughness, heat resistance, resistance to water, electrical properties and adhesion to metal foils. So, it can be used for several usage such as print circuit board, etc.

Now, the present invention will be described more specifically below with reference to working examples. Wherever "parts" are mentioned, they are meant as "parts by weight" as a rule. "Hycar" is the trademark designation used by B. F. Goodrich Chemical Company on liquid acrylonitrile-butadiene rubber products containing carboxyl group. The grades of the products and their properties are as shown below.

CTBN 1300×8: Molecular weight 3,500, bound acrylonitrile content 17% by weight, 1.9 carboxyl groups per molecule CTBN 1300×13: Molecular weight 3,500, bound acrylonitrile content 27% by weight, 1.9 carboxyl groups per molecule "GY-250" and "GY-6071" are the designation used by Ciba Geigy AG on epoxy resin (epoxy equivalent 180, 465 respectively), "YDB-400" the designation used by Toto Chemical Co., Ltd. on epoxy resin (epoxy equivalent 400), and "Epikote 154" the trademark designation used by Shell Chemical Co. on epoxy resin (epoxy equivalent 178).

Synthesis 1

In a four-neck flask, 126 parts of GY-250, 140 parts of GY-6071, 115 parts of CTBN 1300×8, 215 parts of styrene, 2.1 parts of triethylamine and 0.08 part of hydroquinone were allowed to react at 100° C. under introduction of air until the acid number fell below 0.7. The resultant reaction mixture and 120 parts of methacrylic acid added thereto were allowed to react at 100° to 115° C. for until the acid number substantially did not change. Consequently, there was obtained a mixture of rubber-modified vinyl ester with styrene (acid numbers 36; hereinafter referred to as "resin 1"). The reaction time was 4 hours.

For comparison, a similar method was carried out except that the amount of methacrylic acid was changed from 120 parts to 83 parts and the amount of styrene was changed to 215 parts to 199 parts to a mixture of rubber-modified vinyl ester with styrene (acid number 4.8; hereinafter referred to as "comparative resin 1"). The reaction time was 6.3 hours.

Synthesis 2

In a four-neck flask, 400 parts of YDB-400, 100 parts of CTBN 1300×8, 264 parts of styrene, 2.6 parts of triethylamine and 0.09 part of hydroquinone were allowed to react at 100° C. under introduction of air until the acid member fell below 0.7. The resultant reaction mixture, 80 parts of methacrylic acid added and 35 parts of acrylic acid added thereto were allowed to react at 100° to 115° C. until the acid number substantially did not change. Consequently, there was obtained a mixture of a rubber-modified vinyl ester with styrene (acid number 30; hereinafter referred to as "resin 2"). The reaction time was 3.7 hours.

Synthesis 3

In a four-neck flask, 400 parts of YDB-400, 50 parts of CTBN 1300×13, 2.4 parts of triethylamine and 0.08 part of hydroquinone were allowed to react at 100° C. under introduction of air until the acid number fell below 1. The resultant reaction mixture and 100 parts of acrylic acid added thereto were allowed to react at 100° to 115° C. for until the acid number substantially did not change. Consequently, there was obtained a mixture of rubber-modified vinyl ester with styrene (acid number 30; hereinafter referred to as "resin 3"). The reaction time was 4 hours.

Synthesis 4

In a four-neck flask, 126 parts of GY-250, 140 parts of GY-6071, 152 parts of styrene, 88 parts of methacrylic acid, 1.5 parts of triethylamine and 0.05 part of hydroquinone were allowed to react at 100° to 115° C. under introduction of air until the acid number substantially did not change. Consequently, there was obtained a mixture of a rubber-modified vinyl ester with styrene (acid number 4.3; hereinafter referred to as "comparative resin 2"). The reaction time was 9 hours.

Synthesis 5

A mixture of a rubber-modified vinyl ester with styrene (acid number 46; hereinafter referred to as "comparative resin 3") was obtained by following the procedure of Synthesis 4, except that the amount of methacrylic acid was changed from 88 parts to 125 parts and that the amount of styrene was changed from 152 parts to 167 parts. The reaction time was 4 hours.

Synthesis 6

In a four-neck flask, 360 parts of a reaction product of 1 mol of bisphenol A and 2.1 mols of propylene oxide (residual phenolic hydroxyl group concentration 120 ppm and alcoholic hydroxyl group concentration 5.7 equivalent/kg) and 98 parts of maleic anhydride were allowed to react at 200° C. under introduction of nitrogen gas until an acid number 38 was obtained. Consequently, there was obtained an unsaturated polyester (hereinafter referred to as "UP-1").

Synthesis 7

In a four-neck flask, 211 parts (0.6 mol) of a reaction product of 1 mol of bisphenol A and 2.1 mols of propylene oxide (residual phenolic hydroxyl group concentration 120 ppm and alcoholic hydroxyl group concentration 5.7 equivalent/kg, BPX-11, trade name of Asahi Denka Kogyo K.K.), 33 parts (0.43 mol) of propylene glycol, 69 parts (0.7 mol) of maleic anhydride and 50 parts (0.3 mol) of isophthalic acid were allowed to react at 200° C. under introduction of nitrogen gas until an acid number 32 was obtained. Consequently, there was obtained an unsaturated polyester (hereinafter referred to as "UP-2").

Synthesis 8

In a four neck flask, 78 parts (1.03 mol) of propylene glycol, 69 parts (0.7 mol) of maleic anhydride and 50 parts (0.3 mol) of isophthalic acid were allowed to react at 210° C. under introduction of nitrogen gas until an acid number 25 was obtained. Consequently, there was obtained an unsaturated polyester (hereinafter referred to as "UP-3").

EXAMPLES 1–4 AND CONTROLS 1–3

Various impregnating solution (II) were prepared by severally blending varying the resin 1 to resin 3 and the unsaturated polyesters (1) to (3) with styrene, and adding one part of benzoyl peroxide in the obtained resin solution, based on 100 parts of the resin solution. Then the electric copper-plated laminate sheet 1.6 mm in thickness was obtained by impregnating the glass cloth for electric lamination (produced by Nitto Boseki Co., Ltd., marked under designation of "WE-18K-BS"; hereinafter referred to simply as "glass cloth") into the impregnating solution (II), laminating 8 sheets of glass cloth obtained on a treated surface of a copper 35 micron in thickness for electric lamination (produced by Furukawa Circuit Foil Co., Ltd., marked under designation of "TSTO"; hereinafter referred to simply as "copper foil"), covering with a polyester film the upper surface of the resultant laminate, and curing by heating at 80° C. for 30 minutes and at 110° C. for 20 minutes.

The component of impregnating solution (II) and the properties of electric copper foil-plated laminate sheet are shown in Table 1.

TABLE 1

| | | Impregnating solution (II) note 1 | | Properties of electric copper foil-plated laminate sheet | | | | | | | |
|---|---|---|---|---|---|---|---|---|---|---|---|
| | | | weight ratio of component (part) | PCT (note 2) | | Resistance to solder at 260° C. (Sec.) | Dielectric constant | | Dielectric loss | | |
| | Component | | | water-absorption ratio (%) | | | Ordinary state (note 3) | After moisture absorption (note 3) | Ordinary state (note 3) | After moisture absorption (note 3) | Punching property (note 4) | Resistance to solvent (min.) (note 5) | Adhesion strength between layers (kg) (note 6) |
| Example 1 | Resin 1 | | 75 | 0.52 | | 30 | 3.7 | | 0.022 | | VG | >60 | 2.2 |
| | UP-1 | | 10 | | | | | | | | | | |
| | Styrene | | 15 | | | | | 3.7 | | 0.022 | | | |
| Example 2 | Resin 2 | | 80 | 0.51 | | 31 | | 3.6 | | 0.021 | VG | >60 | 2.3 |
| | UP-1 | | 8 | | | | | | | | | | |
| | Styrene | | 12 | | | | 3.6 | | 0.021 | | | | |
| Example 3 | Resin 3 | | 80 | 0.53 | | 30 | | 3.6 | | 0.022 | VG | >60 | 2.3 |
| | UP-1 | | 10 | | | | | | | | | | |
| | Styrene | | 10 | | | | | | | | | | |
| Example 4 | Resin 3 | | 80 | 0.55 | | 28 | 3.6 | | 0.022 | | VG | >60 | 2.3 |
| | UP-2 | | 10 | | | | | 3.7 | | 0.023 | | | |
| | Styrene | | 10 | | | | | | | | | | |
| Control 1 | Resin 1 | | 95 | 0.70 | | 15 | 3.7 | | 0.023 | | VG | 5 | 2.1 |
| | Styrene | | 5 | | | | 4.2 | 4.2 | 0.028 | 0.028 | | | |
| Control 2 | Comparative resin 1 | | 95 | | | | 4.2 | | 0.029 | | | | |
| | Styrene | | 5 | | | | | | | | | | |
| Control 3 | Resin 3 | | 80 | 0.72 | | 11 | 4.2 | | 0.029 | | P | >60 | 0.8 |
| | UP-3 | | 10 | 0.68 | | 17 | 4.0 | | 0.027 | | | | |
| | Styrene | | 10 | | | | 4.1 | | 0.028 | | VG | >60 | 2.2 |

(Note 1) The impregnation solution (II) contains one phr (part per hundred parts of resin) of benzoyl peroxide.
(Note 2) Pressure cooker test
Sample: A piece of laminated plate 40 mm × 40 mm obtained by completely removing the copper foil from laminated plate by etching and cutting the denuded plate with a diamond cutter.
Treating conditions: 133° C. for 60 minutes.
Calculation of water absorption ratio:

$$\text{Water absorption ratio (\%)} = \frac{\left(\begin{array}{c}\text{Weight after}\\\text{PCT treatment}\end{array}\right) - \left(\begin{array}{c}\text{Weight before}\\\text{PCT treatment}\end{array}\right)}{\text{Weight before PCT treatment}} \times 100$$

It is found that the electric copper foil-plated laminate sheets obtained in Examples 1 to 4 excel in PCT property, resistance to methylene chloride, electrical properties and workability (punching property). On the contrary, the laminate sheet obtained in Controls 1 and 3 are inferior in PCT property and apt to occur troubles of snapping of a wire of through hole plating after storage for 1 month under the high humidity condition of summer season, and further the resistance to solvent is extremely low, so it cannot be subjected to use wherein a resist is removed by methylene chloride. Further, the laminate sheet obtained in Control 2 is inferior in not only PCT property but also punching property and adhesion strength between layers, so it cannot be used because of many troubles during working.

EXAMPLE 5 AND CONTROLS 4 TO 6

The electric copper foil-plated laminate sheets were prepared by following the procedure of Example 1 using the resin 1, the control resins 1 to 3, the UP-1 and styrene. The copper foil of the laminate sheet was subjected to a peeling test. The component of the impregnating solution (II) used and the test result of the peeling test are shown in Table 2.

TABLE 2

|  | Impregnating solution (II) (note 1) | | Copper foil peeling strength (kg) |
|---|---|---|---|
|  | Component | Weight ratio |  |
| Example 5 | Resin 1 | 75 | 2.5 |
|  | UP-1 | 10 |  |
|  | Styrene | 15 |  |
| Control 4 | Comparative resin 1 | 75 | 0.6 |
|  | UP-1 | 10 |  |
|  | Styrene | 15 |  |
| Control 5 | Comparative resin 2 | 75 | 0.9 |
|  | UP-1 | 10 |  |
|  | Styrene | 15 |  |
| Control 6 | Comparative resin 3 | 75 | 1.4 |
|  | UP-1 | 10 |  |
|  | Styrene | 15 |  |

In the case of using an epoxy resin and an acid moiety (about equivalent) so that the ratio of carboxyl group and epoxy group is beyond the limits of the present invention, the peeling strength of Control 4 using a rubbery polymer (b) shows 0.6 kg, that the Control 5 without the rubbery polymer (b) shows 0.9 kg and the value of Control 4 decreases by 33% than that of control 5. Adversely, in the case of using an epoxy resin and an acid moiety (carboxyl group/epoxy group = 1.45) for the ratio of carboxyl group and epoxy group is within the limits of the present invention, the peeling strength of Example 5 using the rubbery polymer (b) shows 2.5 kg, that of Control 6 without the rubbery polymer (b) shows 1.4 kg and that of Example 5 grows by 78% than that of Control 6. This high peeling strength is obtained by the interaction of "usage of the rubbery polymer (b)" and "usage of the epoxy group and carboxyl group in a specific ratio". Consequently, the electric metal foil-plated laminate sheet of the present invention using radical polymerizable thermosetting resin type, exhibiting high peeling strength can be obtained.

EXAMPLES 6 TO 7 AND CONTROLS 7 TO 8

Several impregnating solutions (II) was prepared by corresponding the procedure of Example 1 using the resin 2, the UP-1 and styrene. When a production line stopped temporarily for some reasons in the continuous production system of the electric metal foil-plated laminate sheet according to the above corresponding molding method (b) using the impregnating solutions (II), the effect of the impregnating solutions (II) affected and that of the products affected were checked. The test results are shown in Table 3. These tests are carried out according to the following methods.

Test for the degree affected by impregnating solution (II) (setting test)

The impregnating solution (II) is poured into a bat at 30° C., left standing for 60 minutes, and the change of the impregnating solution (II) is observed during above period.

The test for the product affected by impregnating solution (II)

After the setting test is over, the substrate (glass cloth) is immediately deposited with the surface solution of the impregnating solution (II) and treated according to the corresponding procedure of Example 1 to form the copper foil-plated laminate sheet. Then, FRP plate after peeling and removing the copper foil of laminate sheet was observed and the uniformity thereof was checked.

TABLE 3

|  | Component of impregnating solution (II) (part) (note 7) | | | Setting test | Effect to product |
|---|---|---|---|---|---|
|  | Resin 2 | UP-1 | Styrene |  |  |
| Example 6 | 67 | 10 | 23 | Appearance is not changed after 60 minutes | Homogeneous |
| Example 7 | 50 | 20 | 30 | Appearance is not changed after 60 minutes | Homogeneous |
| Control 7 | 85 | 0 | 15 | A part of blushing occured on the surface of solution after 12 minutes and then blushing grew. | Blushing disperses irregularly along the glass interstice. |
| Control 8 | 79 | 3 | 18 | A part of blushing occured on the surface of solution after 17 minutes and then blushing grew. | Blushing disperses irregularly along the glass interstice. |

(Note)
The impregnation solution (II) contains one phr of benzoil peroxide.

It is found from Table 3 that when the amount of unsaturated polyester (1) decreases and a production line stops temporarily, the impregnating solution (II) used grows heterogeneous for a short time and then when the said solution (II) is used as it is, it results in the heterogeneity of the products, so that it is not acceptable for a continuous production system.

What is claimed is:

1. An electric metal foil-plated laminate sheet which is obtained by laminating a cured layer of a thermosetting resin composition with electroconductive foils, said thermosetting resin composition comprising 30–85% by weight of (A) a rubber-modified vinyl ester obtained by reacting
   (a) an epoxy resin,
   (b) a carboxyl group containing rubbery polymer derived from a conjugated diene, and
   (c) at least one unsaturated monocarboxylic acid selected from the group consisting of acrylic acid and methacrylic acid to react one another in amounts such that, based on 100 parts by weight of (a) the epoxy resin, (b) the carboxyl group containing rubbery polymer accounts for a proportion in the range of 5 to 80 parts by weight and that the total number of carboxylic groups contained in (b) the rubbery polymer and (c) the unsaturated monocarboxylic acid falls in the range of 1.3 to 1.5 per each of the epoxy groups contained in (a) the epoxy resin at a temperature of 90° to 120° C., 5–30% by weight of (B) an unsaturated polyester derived from an unsaturated polycarboxylic acid or anhydride and a dihydric alcohol represented by the formula I in an amount accounting for at least 50% by equivalent weight based on the total alcohol component:

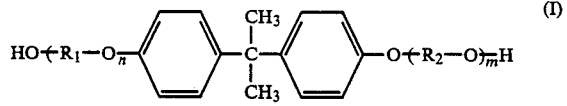 (I)

wherein m and n independently denote an integer of the value of 1 to 4 and collectively satisfy the expression, $2 \leq m+n \leq 5$, $R_1$ and $R_2$ independently denote an alkylene group having 2 or 3 carbon atoms, and the part $(R_1-O)_n$ and the part $(R_2-O)_m$ each may denote a random bond of mutually different repeating units, and 10–60% by weight of (C) a radically polymerizable unsaturated monomer, wherein total of (A), (B) and (C) equals 100% by weight.

2. An electric metal foil-plated laminate sheet according to claim 1, wherein (a) the epoxy resin is a compound possessing at least two epoxy groups in the molecular unit derived from at least one phenolic compound selected from group consisting of bisphenol A, bisphenol F, brominated bisphenol A, phenol novolak, brominated phenol novolak and cresol novolak with at least one compound selected from the group consisting of epichlorohydrin and 2-methyl epichlorohydrin.

3. An electric metal foil-plated laminate sheet according to claim 1, wherein (b) said rubbery polymer has 1 to 5,carboxylic groups in the molecule.

4. An electric metal foil-plated laminate sheet according to claim 1, wherein (b) said rubbery polymer has a number average molecular weight of 1,000 to 20,000.

5. An electric metal foil-plated laminate sheet according to claim 1, wherein (b) said rubbery polymer is acrylonitrile-butadiene copolymer.

6. An electric metal foil-plated laminate sheet according to claim 5, wherein said acrylonitrile-butadiene copolymer contains 5 to 30% by weights of acrylonitrile.

7. An electric metal foil-plated laminate sheet according to claim 1, wherein a ratio of (b) said rubbery polymer in said resin composition is 1 to 30% by weight.

8. An electric metal foil-plated laminate sheet according to claim 1, wherein (C) said radically polymerizable unsaturated monomer is a compound possessing at least one radically polymerizable unsaturated group and not more than about 400 of molecular weight.

9. An electric metal foil-plated laminate sheet according to claim 1, wherein a ratio of (b) said rubbery polymer in said resin composition is 3 to 20% by weight.

10. An electric metal foil-plated laminate sheet according to claim 1, wherein said electroconductive foil is copper or aluminum foil.

11. An electric metal foil-plated laminate sheet according to claim 1, wherein said electroconductive foil is copper foil.

12. An electric metal foil-plated laminate sheet according to claim 1, wherein said cured layer of said thermosetting resin contains reinforcing materials.

* * * * *